United States Patent
Narita (12)

(10) Patent No.: US 6,637,009 B2
(45) Date of Patent: Oct. 21, 2003

(54) OPTIMIZATION OF A LOGIC CIRCUIT HAVING A HIERARCHICAL STRUCTURE

(75) Inventor: Hiroki Narita, Tokyo (JP)

(73) Assignee: NEC Corporation, Tokyo (JP)

( * ) Notice: Subject to any disclaimer, the term of this patent is extended or adjusted under 35 U.S.C. 154(b) by 43 days.

(21) Appl. No.: 09/946,484

(22) Filed: Sep. 6, 2001

(65) Prior Publication Data

US 2002/0032895 A1 Mar. 14, 2002

(30) Foreign Application Priority Data

Sep. 8, 2000 (JP) ........................................ 2000-273614

(51) Int. Cl.[7] .............................................. G06F 17/50
(52) U.S. Cl. ................................................ 716/2; 716/1
(58) Field of Search ...................................... 716/1–14

(56) References Cited

U.S. PATENT DOCUMENTS

| 5,067,091 | A | * | 11/1991 | Nakazawa ...................... 716/3 |
| 5,359,535 | A | * | 10/1994 | Djaja et al. ..................... 716/6 |
| 5,475,607 | A | * | 12/1995 | Apte et al. ..................... 716/10 |
| 5,594,891 | A | * | 1/1997 | Koseko .......................... 716/1 |
| 2001/0056568 | A1 | * | 12/2001 | Hirotsu et al. ................. 716/6 |

FOREIGN PATENT DOCUMENTS

| JP | S63-280301 | 11/1988 |
| JP | 9-259173 | 10/1997 |
| JP | 10-91651 | 4/1998 |
| JP | H10-198711 | 7/1998 |
| JP | 10-320426 | 12/1998 |
| JP | 2000-172726 | 6/2000 |

* cited by examiner

Primary Examiner—Vuthe Siek
Assistant Examiner—Sun James Lin
(74) Attorney, Agent, or Firm—Sughrue Mion, PLLC

(57) ABSTRACT

A method and device are disclosed for easy and proper optimization of a logic circuit having a hierarchical structure. A limit value storage unit stores in advance target delay values that are the limit values of delay times. A flip-flop extraction unit extracts flip-flops included in the logic circuit that is the object of optimization and that is stored in a logic circuit storage unit. A hierarchy modification unit traces the logic circuit in the opposite direction of signal flow from an external output terminal of the logic circuit or the input of an extracted flip-flop until reaching an external input terminal of the logic circuit or another flip-flop and then modifies the hierarchical structure of the logic circuit to a structure constituted by hierarchical circuits that are each including logic elements that were passed through and flip-flops that were reached. A hierarchical circuit merge unit joins hierarchical circuits that include the same flip-flop. A logic optimization execution unit optimizes each of the hierarchical circuits such that their delay times satisfy the target delay values.

6 Claims, 3 Drawing Sheets

OPTIMIZATION OF A LOGIC CIRCUIT HAVING A HIERARCHICAL STRUCTURE

BACKGROUND OF THE INVENTION

1. Field of the Invention

The present invention relates to a method and device for optimizing a logic circuit represented by a circuit diagram or hardware description language, and more particularly to a method and device for optimizing a logic circuit having a hierarchical structure.

2. Description of the Related Art

The automatic generation of a logic circuit from information such as hardware description language is carried out so as to satisfy constraints such as delay time or available area for packaging, i.e., limit values. In optimization that takes as its object a logic circuit having a hierarchical structure including a plurality of hierarchies, the target limit values of the delay time or available area for packaging are determined in advance.

In a prior art method to optimize a logic circuit with a predetermined delay time as the target, limit values are first established with due consideration given to the delay between flip-flops and input terminals of each hierarchy as well as to the delay between the flip-flops and output terminals, the established limit values are given to the input terminal and output terminal of each hierarchy, and the optimization process is performed for each hierarchy. With this method, the optimization of the logic circuit of each hierarchy lead to the optimization of the entire circuit.

However, since the delay time limit values were determined by taking into consideration the flip-flops in each hierarchy in the optimization method of the prior art, these limit values were meaningless if paths existed that did not pass through the flip-flops in a hierarchy, and normal optimization could not be carried out. For these paths, the hierarchies were manually restructured and the limit values were again determined.

SUMMARY OF THE INVENTION

It is an object of the present invention to provide a method and device for easy and proper optimization of a logic circuit of hierarchical structure that includes at least one flip-flop.

In the present invention, target delay values, which are the limit values of delay times, are determined in advance. The logic circuit is then modified to a hierarchical structure of a plurality of hierarchical circuits that take as interfaces: the input terminals of flip-flops, the external input terminals of the logic circuit, and the external output terminals of the logic circuit. Each of the hierarchical circuits is then optimized such that the delay times are less than or equal to the target delay values.

The hierarchical structure of the logic circuit that is the object of optimization is thus modified such that the input terminals of flip-flops become the interfaces of each hierarchical circuit, to thereby execute the optimization process after establishing a state in which there are no paths that do not pass through flip-flops in each hierarchical circuit.

According to another aspect of the present invention, target delay values, which are the limit values of delay times, are determined in advance, following which the flip-flops included in the logic circuit are extracted. The logic circuit is then traced in the direction that is opposite the flow of signals from an external output terminal of the logic circuit or the input of an extracted flip-flop until reaching an external input terminal of the logic circuit or another flip-flop. The hierarchical structure of the logic circuit is then altered to a structure composed of hierarchical circuits that include the logic elements that were passed through and the flip-flops that were reached. Hierarchical circuits that include the same flip-flops are next joined. Finally, each of the hierarchical circuits is optimized such that the delay times are equal to or less than the target delay values.

The logic circuit optimization device according to the present invention comprises a limit value storage means, a hierarchy restructuring means, and a logic optimization execution means.

The limit value storage means stores in advance the target delay values, which are the limit values of delay times. The hierarchy restructuring means restructures a logic circuit into a hierarchical structure composed a plurality of hierarchical circuits that take as interfaces the input terminals of flip-flops, the external input terminals of the logic circuit, and the external output terminals of the logic circuit. The logic optimization execution means optimizes each hierarchical circuit such that the delay times are equal to or less than the target delay values.

According to another aspect of the invention, a logic circuit optimization device comprises a limit value storage means, a flip-flop extraction means, a hierarchy modification means, a hierarchical circuit merge means, and a logic optimization execution means.

The limit value storage means stores in advance target delay values, which are the limit values of the delay times. The flip-flop extraction means extracts flip-flops included in the logic circuit. The hierarchy modification means traces the logic circuit in the direction that is opposite the flow of signals from an external output terminal of the logic circuit or the input terminal of an extracted flip-flop until reaching an external input terminal of the logic circuit or another flip-flop and modifies the hierarchical structure of the logic circuit to a structure composed of hierarchical circuits that are each constituted by the logic elements that were passed through and the flip-flops that were reached. The hierarchical circuit merge means joins hierarchical circuits that include the same flip-flop. The logic optimization execution means optimizes each of the hierarchical circuits such that the delay times are equal to or less than the target delay values.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1:
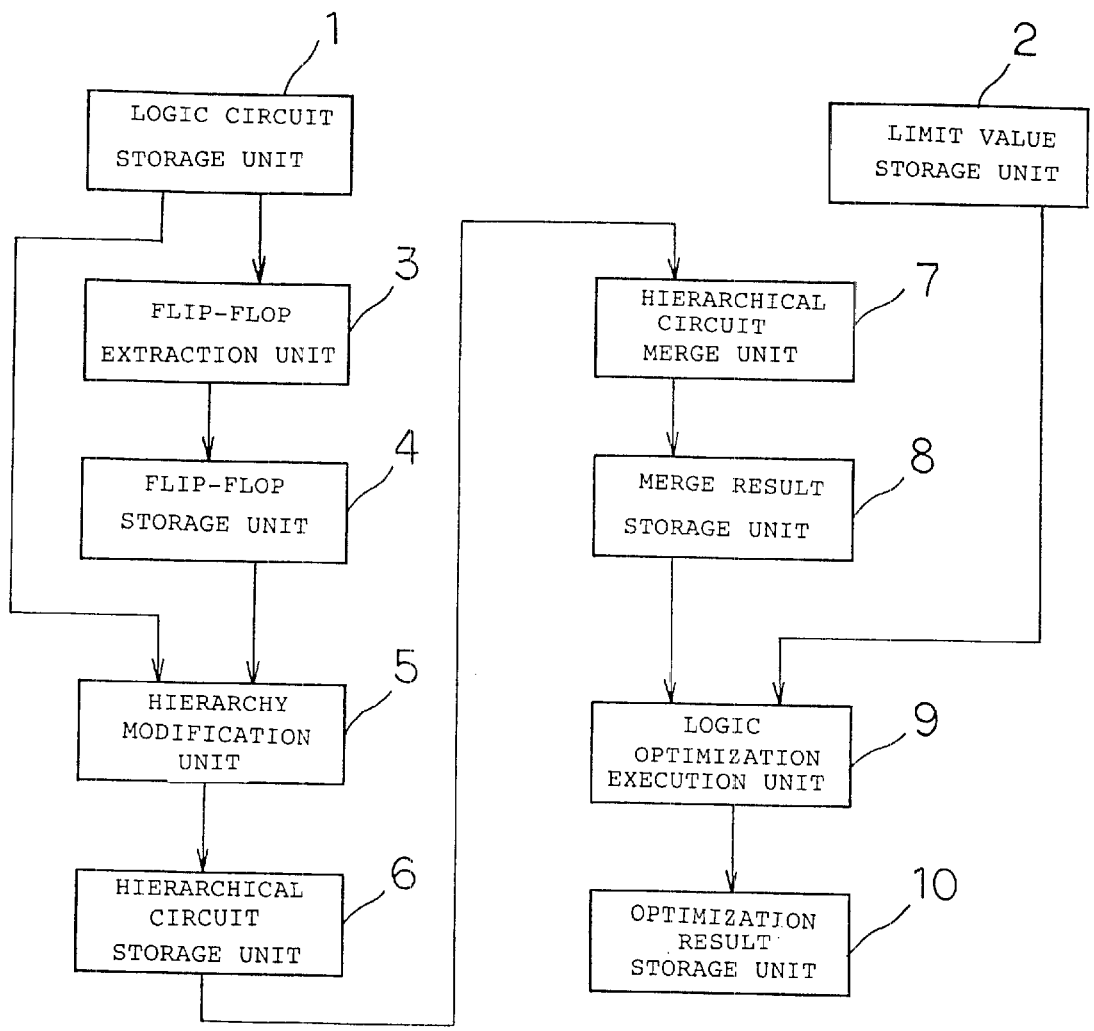
FIG. 1 is a block diagram showing the construction of an optimization device according to an embodiment of the present invention.

Referring now to FIG. 1, there is shown an optimization device according to an embodiment of the present invention comprising: logic circuit storage unit 1, limit value storage unit 2, flip-flop extraction unit 3, flip-flop storage unit 4, hierarchy modification unit 5, hierarchical circuit storage unit 6, hierarchical circuit merge unit 7, merge result storage unit 8, logic optimization execution unit 9, and optimization result storage unit 10.

Logic circuit storage unit 1 stores information of the logic circuit that is the object of optimization that is represented by a circuit diagram or hardware description language. Limit value storage unit 2 stores the limit values of the optimization process for the logic circuit information stored in logic circuit storage unit 1, such as the target delay values that are the limit values of delay times. Flip-flop extraction unit 3 extracts information of flip-flops from logic circuit information of logic circuit storage unit 1 and stores the information in flip-flop storage unit 4. Flip-flop storage unit 4 stores information of flip-flops that have been extracted by flip-flop extraction unit 3. Hierarchy modification unit 5 modifies the hierarchical structure of the logic circuit information stored in logic circuit storage unit 1 such that it is composed of hierarchical circuits that take as interfaces the inputs of flip-flops stored in flip-flop storage unit 4, and thereby stores in hierarchical circuit storage unit 6 logic circuit information in which there are no paths that do not pass through flip-flops in each hierarchical circuit. Hierarchical circuit storage unit 6 stores logic circuit information in which the hierarchical structure has been modified by hierarchy modification unit 5. Hierarchical circuit merge unit 7 extracts logic circuits that include the same flip-flop from among the hierarchical circuits stored in hierarchical circuit storage unit 6, joins (i.e., merges) these hierarchical circuits into single hierarchical circuits, and stores the resulting logic circuit information in merge result storage unit 8. The logic circuit is modified by the processing of hierarchical circuit merge unit 7 to a hierarchical structure composed of a plurality of hierarchical circuits that take as interfaces the input terminals of flip-flops, the external input terminals of the logic circuit, or the external output terminals of the logic circuit. With this hierarchical structure, there are no overlapped portions among a plurality of hierarchical circuits. Merge result storage unit 8 stores logic circuit information in which hierarchical circuits have been merged as necessary by hierarchical circuit merge unit 7. Logic optimization execution unit 9 sets the limit value for the arrival time at the input terminal of each of the hierarchical circuits stored in merge result storage unit 8 as "0 ns", and optimizes each of the hierarchical circuits such that, at the output terminals, the hierarchical circuits satisfy the target delay values stored in limit value storage unit 2. Logic optimization execution unit 9 also stores the logic circuit information obtained as a result of the optimization process in optimization result storage unit 10. Optimization result storage unit 10 stores the optimized logic circuit information.

Operation to optimize the logic circuit shown in FIG. 2 will next be described as an example of the operation of the optimization device of this embodiment.

Figure 2:
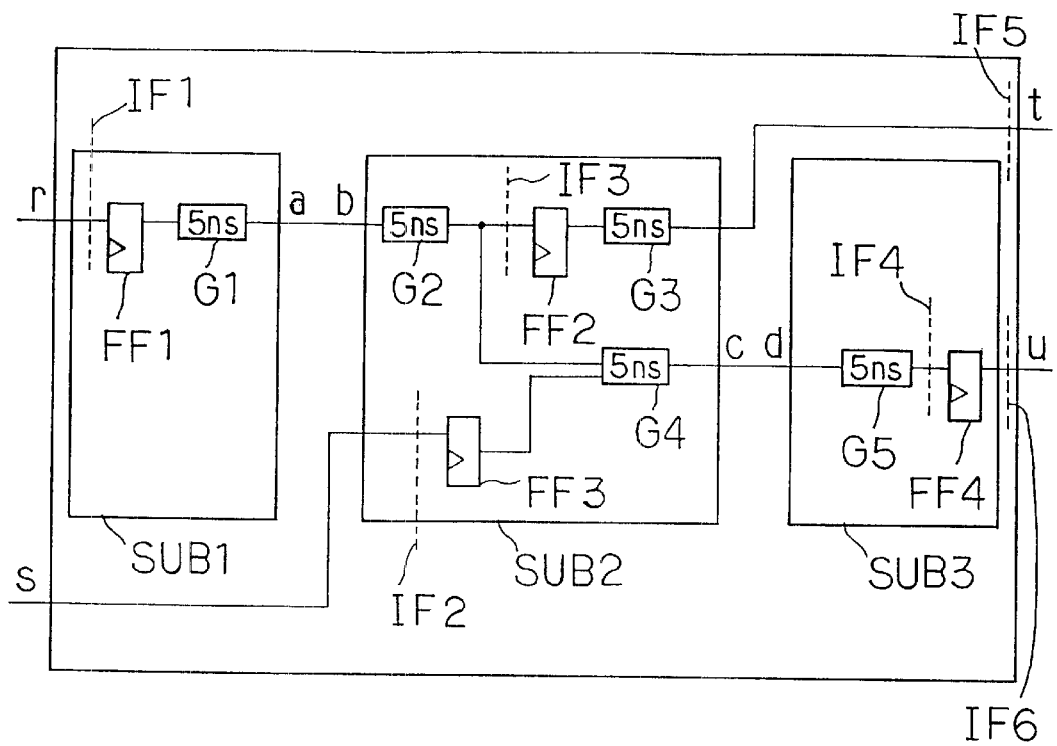
FIG. 2 is a circuit diagram showing an example of a logic circuit for explaining the operation of the optimization device of FIG. 1.

The logic circuit information of the circuit shown in FIG. 2 is stored in logic circuit storage unit 1. The logic circuit is of a structure in which hierarchical circuits are connected together as necessary. Each hierarchical circuit is of a construction in which logic elements and flip-flops that operate in synchronism are connected with each other.

In the example shown in FIG. 2, hierarchical circuit SUB1 consists of flip-flop FF1 and logic element G1. Hierarchical circuit SUB2 consists of flip-flops FF2 and FF3 and logic elements G2, G3, and G4, and hierarchical circuit SUB3 consists of flip-flop FF4 and logic element G5. The entire logic circuit consists of hierarchical circuits SUB 1, SUB2, and SUB3. In the figure, the values (for example, 5 ns) noted inside the blocks of the logic elements indicate the delay time of the logic elements.

It is herein assumed that the target delay value stored in limit value storage unit 2 is, by way of example, "10 ns."

When the optimization process is started, flip-flop extraction unit 3 first fetches the information of flip-flops FF1, FF2, FF3, and FF4 from the logic circuit information stored in logic circuit storage unit 1 and stores the information in flip-flop storage unit 4. Hierarchy modification unit 5 next determines the inputs (interfaces IF1, IF2, IF3, and IF4 in FIG. 2) of flip-flops FF1, FF2, FF3, and FF4 stored in flip-flop storage unit 4 and external output terminals t and u (interfaces IF5 and IF6 in FIG. 2) as the interfaces in the logic circuit stored in logic circuit storage unit 1. Hierarchy modification unit 5 further traces the circuit in the direction opposite to the flow of signals from each of interfaces IF1, IF2, . . . , IF6 (toward the input) until the output terminal of another flip-flop or an external input terminal of the logic circuit is reached. When the output terminal of a flip-flop is reached, hierarchy modification unit 5 constructs a new hierarchical circuit of the flip-flop and the logic elements that were passed through in tracing. When an external input terminal is reached, hierarchy modification unit 5 takes no action. Tracing from interface IF1 and interface IF2 in FIG. 2 in the direction toward input leads to external input terminals r and s, respectively, and consequently, no action is taken.

Figure 3:
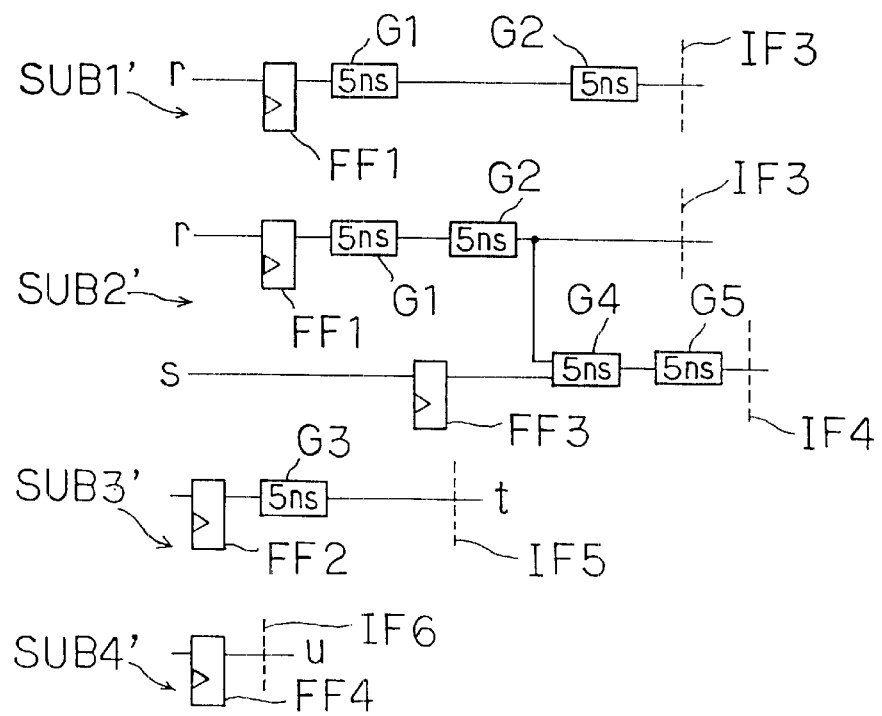
FIG. 3 is a circuit diagram showing the new hierarchical circuits obtained by the hierarchy modification unit of the optimization device of FIG. 1.

Tracing toward the input from interface IF3 leads through logic elements G2 and G1, and arrives at the output terminal of flip-flop FF1. As a result, hierarchy modification unit 5 constructs a new hierarchical circuit SUB1' composed of flip-flop FF1 and logic elements G1 and G2. On the other hand, when the circuits is traced in the direction toward the input from interface IF4, the output terminals of two flip-flops FF1 and FF3 are reached through logic elements G5, G4, G2 and G1. Hierarchy modification unit 5 thus constructs a new hierarchical circuit SUB2' composed of flip-flops FF1 and FF3 and logic elements G1, G2, G4, and G5. When the circuits is traced in the direction toward the input from interface IF5, the output terminal of flip-flop FF2 is reached through logic element G3. Hierarchy modification unit 5 thus constructs a new hierarchical circuit SUB3' composed of flip-flop FF2 and logic element G3. When the circuits are traced in the direction toward input from interface IF6, the output terminal of flip-flop FF4 is reached. Hierarchy modification unit 5 thus constructs a new hierarchical circuit SUB4' from only flip-flop FF4. Hierarchy modification unit 5 then stores the new hierarchical circuits SUB1', SUB2', SUB3', and SUB4' shown in FIG. 3 and constructed above in hierarchical circuit storage unit 6.

Hierarchical circuit merge unit 7 next extracts the hierarchical circuits that include the same flip-flops from hierarchical circuits SUB 1', SUB2', SUB3', and SUB4' stored in hierarchical storage unit 6, and merges such circuits into a single hierarchical circuit. In this case, since hierarchical circuit SUB 1' and hierarchical circuit SUB2' both include flip-flop FF1, these circuits are merged. The circuit resulting from merging hierarchical circuit SUB 1' and hierarchical SUB2' is identical to hierarchical circuit SUB2'. Hierarchical circuit merge unit 7 then stores the information of the logic circuits shown in FIG. 4 that is obtained by merging hierarchical circuits in merge result storage unit 8.

Figure 4:
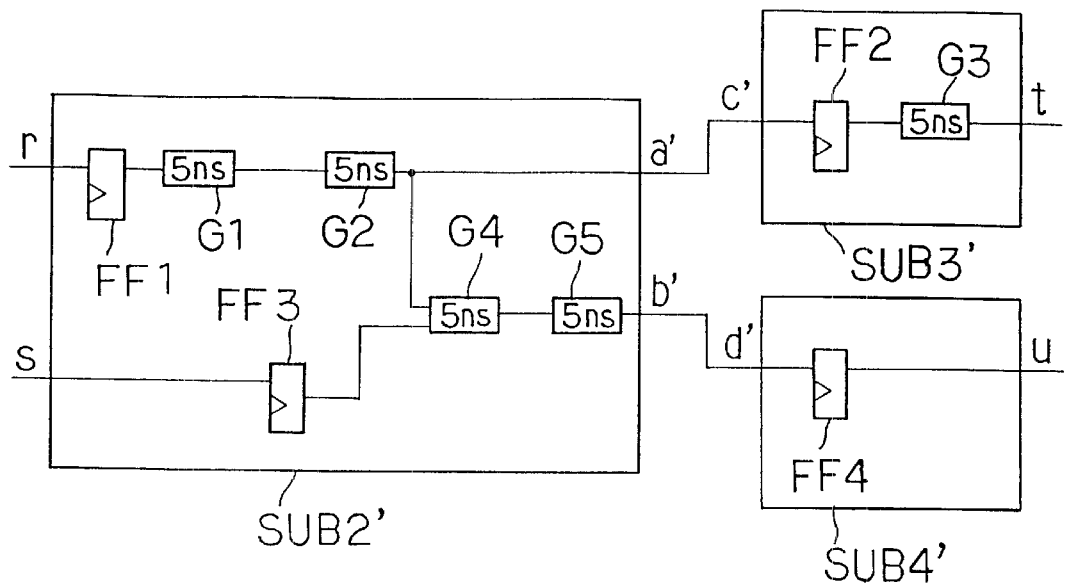
FIG. 4 is circuit diagram showing a logic circuit obtained by hierarchical circuit merge unit of the optimization device of FIG. 1.
Figure 5:
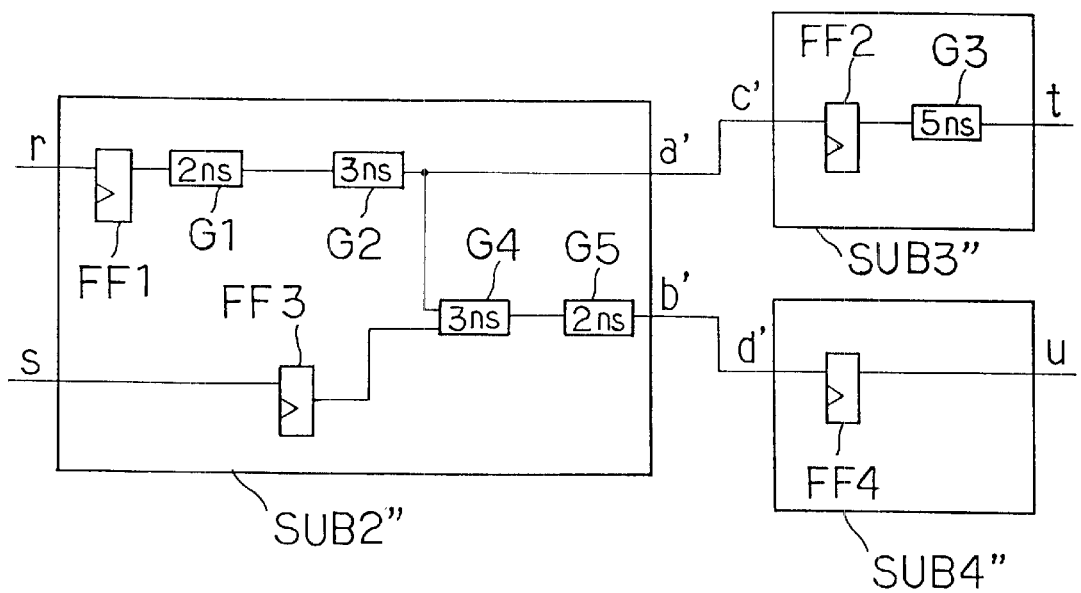
FIG. 5 is a circuit diagram showing an optimized logic circuit finally obtained by the optimization device of FIG. 1.

Logic optimization execution unit 9 next determines the limit values for the times that elapsed before input terminals r, s, c', and d' of each of the hierarchical circuits SUB2', SUB3' and SUB4' in the logic circuits of FIG. 4 are reached, and stored in merge result storage unit 8 to be "0 n". In addition, logic optimization execution unit 9 determines the limit values for the expected times that elapsed before output terminals a', b', t, and u are reached to be the target delay value "10 ns" that is stored in limit value storage unit 2. Logic optimization execution unit 9 then executes the optimization process for each of hierarchical circuits SUB2', SUB3', and SUB4' and stores the logic circuit information of FIG. 5 that is obtained as the result of this process in optimization result storage unit 10 to complete the optimization process.

The optimization device of this embodiment modifies the hierarchical structure of the logic circuit that is the object of optimization such that the input terminals of flip-flops are the interfaces of each hierarchical circuit and then, after having established a state in which there are no paths that do not pass through flip-flops in each hierarchical circuit, executes the optimization process. This process eliminates the need for special processing such as manual restructuring of hierarchies or recreation of limit values.

The present invention may also be implemented on a computer in the form of computer program that includes the processes of each unit.

While preferred embodiments of the present invention have been described using specific terms, such description is for illustrative purposes only, and it is to be understood that changes and variations may be made without departing from the spirit or scope of the following claims.

What is claimed is:

1. A method of optimizing a logic circuit that includes a plurality of flip-flops, the method comprising the steps of:

determining in advance target delay values, said target delay values being limit values of delay times of all signal paths between the external input terminals and output terminals;

modifying said logic circuit to a hierarchical structure, said hierarchical structure composed of circuits, said circuits in total comprising a schematic of said logic circuit, wherein each individual circuit constitutes a path of said logic circuit in which there axe no paths that do not pass through a flip-flop, and further wherein each individual circuit has as its beginning and/or end: an input terminal of one of said plurality of flip-flops, the external input terminals of said logic circuit, or the external output terminals of said logic circuit; and optimizing each of said individual circuits such that said delay times are less than or equal to said target delay values.

2. A method of optimizing a logic circuit including a plurality of flip-flops, the method comprising the steps of:

determining in advance target delay values, said target delay values being limit values of delay times of all signal paths between the external input terminals and external output terminals;

extracting flip-flop information as to types of-flip-flops from said plurality of flip-flops included in said logic circuit;

tracing said logic circuit through logic elements in said logic circuit in the direction opposite to the flow of signal from an external output terminal of said logic circuit or an input terminal of one of said plurality of flip-flops until an external input terminal of said logic circuit or the output terminal of one of said plurality of flip-flops is reached, and then modifying the structure of said logic circuit to a hierarchical structure, said hierarchical structure composed of individual circuits, said individual circuits in total comprising a schematic of said logic circuit, said individual circuits including said logic elements that were passed through and any flip-flops that were reached;

joining said individual circuits that include the same flip-flop; and optimizing each of said individual circuits such that said delay times are less than or equal to said target delay values.

3. A device for optimizing a logic circuit including a plurality of flip-flops; said optimization device comprising:

a limit value storage means for storing target delay values, said target delay values being limit values of delay times of all signal paths between the external input terminals and external output terminals;

a restructuring means for restructuring said logic circuit to a hierarchical structure, said hierarchical structure constituted by circuits, said circuits in total comprising a schematic of said logic circuit, wherein each individual circuit constitutes a path of said logic circuit in which there are no paths that do not pass through a flip-flop, and further wherein each individual circuit has as its beginning and/or end: an input terminal of one of said plurality of flip-flops the external input terminals of said logic circuit, or the external output terminals of said logic circuit; and a logic optimization execution means for optimizing each of said individual circuits such that said delay times are less than or equal to said target delay values.

4. A logic circuit optimization device for optimizing a logic circuit that includes plurality of flip-flops; said optimization device comprising:

a limit value storage means for storing target delay values, said target delay values being a limit values of delay times of paths between the external input terminals and external output terminals;

a flip-flop extraction means for extracting flip-flop information as to the types of flip-flops from said plurality of flip-flops included in said logic circuit;

a hierarchy modification means for tracing said logic circuit passing through logic elements in said logic circuit in the direction opposite the flow of signals from an external output terminal of said logic circuit or the input of one of said plurality of flip-flops until reaching an external input terminal of said logic circuit or the output terminal of one of said plurality of flip-flops and then modifying the structure of said logic circuit to a hierarchical structure that includes individual circuits, said individual circuits in total comprising a schematic of said logic circuit, said individual circuits constituted by said logic elements that were passed through and any flip-flops that were reached;

a circuit merge means for joining said individual circuits that include the same flip-flop; and a logic optimization execution means for optimizing each of said individual circuits such that said delay times are less than or equal to said target delay values.

5. A computer program product for enabling a computer to execute a process of optimizing a logic circuit that includes a plurality of flip-flops, the computer program product comprising:

a set of instructions for modifying said logic circuit to a hierarchical structure, said hierarchical structure including circuits, said circuits in total comprising a schematic of said logic circuit, wherein each individual circuit constitutes a path of said logic circuit in which there are no paths that do not pass through a flip-flop, and further wherein each individual circuit has as its beginning and/or end: an, input terminal of one of said plurality of flip-flops the external input terminals of said logic circuit, or the external output terminals of said logic circuit; and a set of instructions for optimizing each of said individual circuits such that said delay times of said individual circuits satisfy target delay values, said target delay values being predetermined limit values of delay times of all signal paths between the external input terminals and external output terminals.

6. A computer program product for enabling a computer to execute a process of optimizing a logic circuit that includes a plurality of flip-flops, the computer program product comprising:

a set of instructions for extracting flip-flop information as to the types of flip-flops from said plurality of flip-flops included in said logic circuit;

a set of instructions for tracing said logic circuit, said tracing passing through logic elements in said logic circuit in the direction opposite the flow of signals from an external output terminal of said logic circuit or an input of one of said plurality of flip-flops until reaching an external input terminal of said logic circuit or the output terminal of one of said plurality of flip-flops and then modifying the structure of said logic circuit to a hierarchical structure that includes individual circuits, said individual circuits in total comprising a schematic of said logic circuit, said individual circuits constituted by logic elements that were passed through and any flip-flops that were reached;

a set of instructions for joining said individual circuits that include the same flip-flops; and a set of instructions for optimizing each of said individual circuits such that said delay times of said individual circuits are less than or equal to target delay values, said delay target values being predetermined limit values of delay times of all signal paths between the external input terminals and external output terminals.

* * * * *